United States Patent
Martin et al.

(10) Patent No.: US 9,823,273 B2
(45) Date of Patent: Nov. 21, 2017

(54) PROBE TIP FORMATION FOR DIE SORT AND TEST

(71) Applicant: INTEL CORPORATION, Santa Clara, CA (US)

(72) Inventors: Keith J. Martin, Hillsboro, OR (US); Kip P. Stevenson, Hillsoboro, OR (US); Kamil S. Salloum, Hillsboro, OR (US); Todd P. Albertson, Warren, OR (US)

(73) Assignee: Intel Corporation, Santa Clara, CA (US)

( * ) Notice: Subject to any disclaimer, the term of this patent is extended or adjusted under 35 U.S.C. 154(b) by 617 days.

(21) Appl. No.: 13/931,866

(22) Filed: Jun. 29, 2013

(65) Prior Publication Data

US 2015/0002181 A1    Jan. 1, 2015

(51) Int. Cl.
   *G01R 3/00* (2006.01)
   *G01R 1/067* (2006.01)

(52) U.S. Cl.
   CPC .......... *G01R 3/00* (2013.01); *G01R 1/06738* (2013.01); *Y10T 29/49124* (2015.01)

(58) Field of Classification Search
   CPC ................................................ G01R 1/06738
   See application file for complete search history.

(56) References Cited

U.S. PATENT DOCUMENTS

| | | | | |
|---|---|---|---|---|
| 5,763,879 A | * | 6/1998 | Zimmer | G01R 1/06738 250/307 |
| 6,110,823 A | * | 8/2000 | Eldridge | B23K 20/004 257/E21.503 |
| 6,130,104 A | * | 10/2000 | Yamasaka | G01R 31/316 134/6 |
| 6,132,290 A | * | 10/2000 | Sugiyama | B24B 37/00 451/10 |
| 6,356,090 B2 | * | 3/2002 | Deshayes | G01R 1/07342 324/756.03 |
| 2001/0046715 A1 | * | 11/2001 | Takemoto | G01R 1/06711 438/2 |
| 2002/0190737 A1 | * | 12/2002 | Maekawa | B08B 1/00 324/758.04 |
| 2006/0051948 A1 | * | 3/2006 | Kim | G01R 1/0483 438/597 |
| 2008/0315092 A1 | * | 12/2008 | Kley | G01N 23/225 250/307 |
| 2010/0321820 A1 | * | 12/2010 | Zhou | B82Y 10/00 360/86 |
| 2011/0279137 A1 | * | 11/2011 | Pagani | G01R 1/06761 324/754.03 |
| 2014/0002124 A1 | * | 1/2014 | Albertson | G01R 1/07357 324/756.07 |
| 2014/0239995 A1 | * | 8/2014 | Swart | G01R 1/06711 324/755.06 |

* cited by examiner

*Primary Examiner* — Huy Q Phan
*Assistant Examiner* — Adam Clarke
(74) *Attorney, Agent, or Firm* — Schwabe Williamson & Wyatt P.C.

(57) ABSTRACT

Probe tip formation is described for die sort and test. In one example, the tips of wires of a test probe head are prepared for use as test probes. The wires are attached to a test probe head substrate. The end opposite the substrate has a tip. The tips of the wires are polished when attached to the test probe head to form a sharpened point.

21 Claims, 10 Drawing Sheets

PROBE TIP FORMATION FOR DIE SORT AND TEST

FIELD

The present disclosure relates to integrated circuit test using a probe array and, in particular, to forming the tips of the probes.

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a printed circuit board to allow the die to be operated while within the package. Before packaging, either as part of a wafer or an individual die, each die is tested to determine whether it has been manufactured correctly and operates as intended. In some cases, the dies are also sorted based on performance.

To perform the tests, some dies have lands or pads specifically designed into the die for test purposes. Pins or probes are applied to the lands or pads and signals are sent or received through the pins to test the die. For a more complex die, more pins are used. Similarly for denser circuitry on the die, the pins are closer together.

The test probes are attached to a substrate that holds each probe in the proper position with respect to each other probe so that when the sort interface unit is pressed against the pads on the die, each probe will contact its respective pad. The probes are resilient and have a shaped tip so that when the probes are pressed against the die the pressure will stress and break through any oxide that has formed on the surface of the wafer die bumps in order ensure good electrical contact. The tip wear with each new contact and, as a result, each test probe has a limited number of die tests that it can perform, after which it must be replaced. The replacement cost of each test probe is therefore a factor in the cost of die manufacturing.

The substrate and the probes are typically separately manufactured using a MEMS (microelectromechanical systems) process, or a process similar to how transistors are made. This process provides technology to form many different geometric shapes at the probe tip. The different tips have different abilities to concentrate stress and break through the oxide on different types of wafer die bumps. Once the probes are made, they are assembled onto a space transforming substrate.

Each probe has a curve in its middle section so that when pressed against the die it will bend. The probes must all bend in the same direction so that they do not contact each other during use, possibly creating connections that destroy the die or the probe. Several thousand to tens of thousands of probes may be needed to build one sort interface unit for a microprocessor. This number is expected to increase as die complexity and density increases from today's probe counts. The process is performed manually in part due the shape of the probe. The central curve increases the complexity of the probes being inserted and attached to the space transforming substrate in an automated process.

BRIEF DESCRIPTION OF THE DRAWINGS

Embodiments of the invention are illustrated by way of example, and not by way of limitation, in the figures of the accompanying drawings in which like reference numerals refer to similar elements.

DETAILD DESCRIPTION

A probe head may be made by attaching wires to the probe head substrate. A tip shape, such as a point or a wedge, can be formed before or after the wires are attached. Off-the-shelf metallic wire may be used to avoid a layered buildup process and all of its lithography or etch steps. The process of attaching the wires may be automated. This allows more probes to be attached in denser arrays at lower cost. This approach drastically reduces the cost of test probe arrays and decreases assembly complexity, providing a substantial reduction in the cost of microelectronic device fabrication.

The probe tips for the wires on the substrate of the probe head may be formed in a variety of different ways including laser micro-machining, mechanical cutting, electro-polishing, mechanical polishing, and die forming. The formed tips can be coated to preserve the shape and improve electrical contact resistance.

Figure 1A:
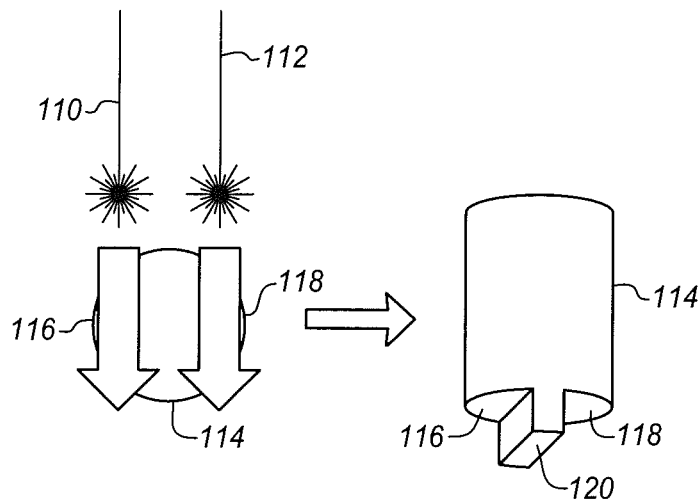
FIG. 1A is cross-sectional side view diagram and finished perspective view diagram of creating a spade tip with laser cutting according to an embodiment.

FIG. 1A is a diagram of creating a spade tip 114 on the end of a wire for a probe head. The probe tip 114 is cut with a micro machining laser 110, 112. Two lasers may make a single pass on the outside edges 116 118 of the probe tip 114, or a single laser may make both passes. As a result, an end of the wire is machined to form a tip or ridge 120 that is long and narrow and surrounded by a recess 116 118 on either side of the probe tip.

Figure 1B:
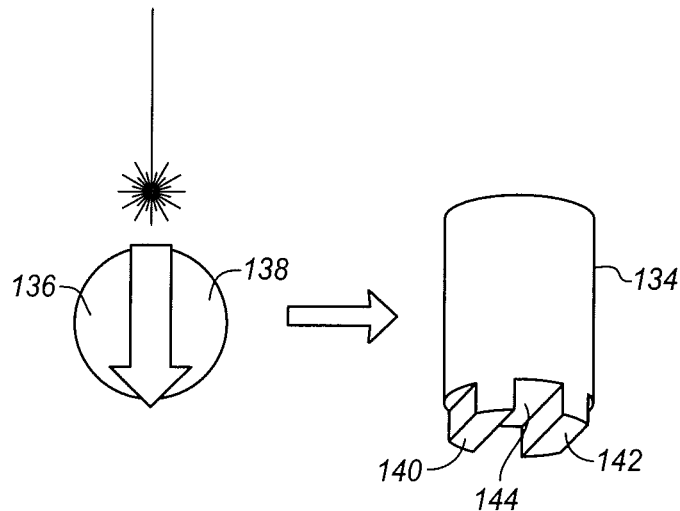
FIG. 1B is cross-sectional side view diagram and finished perspective view diagram of creating a double spade tip with laser cutting according to an embodiment.

FIG. 1B is a diagram of an example of micro machining a double spade tip using a laser. A single laser 130 makes a single machining pass across the center of the end of the probe wire 134. This leaves a recess 144 in the center of the end of the wire and a spade 140 142 on either side 136 138 of the wire.

Figure 1C:
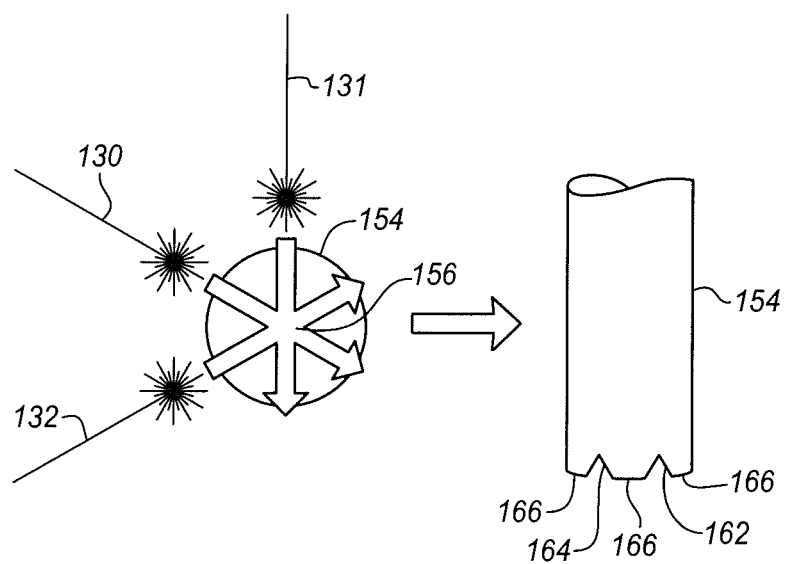
FIG. 1C is cross-sectional side view diagram and finished perspective view diagram of creating a crown tip with laser cutting according to an embodiment.

FIG. 1C is a diagram of creating a crown tip using more passes of a micro-machining laser to form a crisscross pattern. A single or multiple lasers 130, 131, 132 make passes across the end of the wire 154. In the illustrated example, three lasers each make a pass across the end of the wire and through the center of the end of the wire 156. The resulting crown tip has recesses 162, 164 where the micro machining passes cut a groove including the center of the tip. The probe tip 154 also has ridges 166 that extend from six different corners from the end of the wire.

Figure 1D:
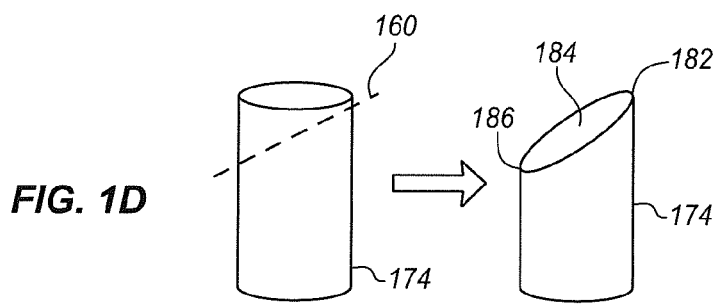
FIG. 1D is cross-sectional side view diagram and finished perspective view diagram of creating a slant tip with laser cutting according to an embodiment.

FIG. 1D is a diagram to show the creation of a slant tip. The end of the wire 174 is cut at a diagonal 160 using laser micro-machining or a mechanical grinder or cutter. This forms a raised tip 182 for contact with the die, a slanted face 184, and a recessed edge 186 opposite the raised end or tip 182. The slant tip, as well as the spade tips or crown tips may be polished as described in more detail herein.

Figure 2A:
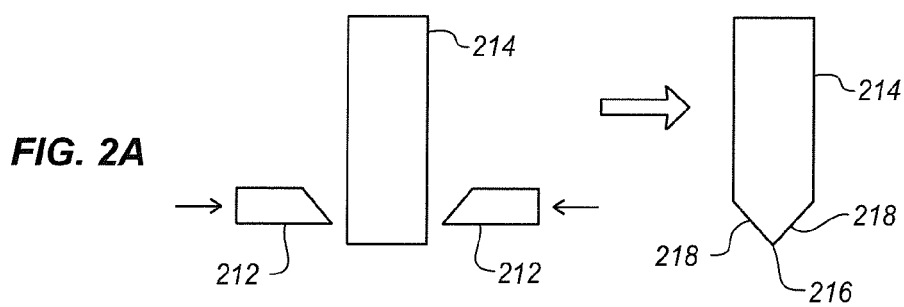
FIG. 2A is a cross-sectional side view diagram and finished perspective view diagram of creating a wedge tip with cutting dies according to an embodiment.

FIG. 2A is a diagram of another tip point creation technique. The probe tip 214 is mechanically cut using a pair of dies 210, 212. In the diagram, a wedge is created by bringing mechanical cutters in on opposing sides of the tip 214. These cutters have a beveled cutting edge and create a wedge upon striking the wire. As shown, the resulting probe tip 214 has a raised tip 216 with recessed edges 218 on either side of the central raised tip. In this example using two cutters, the tip 216 will be in the form of a ridge across the width of the wire 214, however, the cutters may have a curved profile to create a more rounded point 216 at the end of the wire.

Figure 2B:
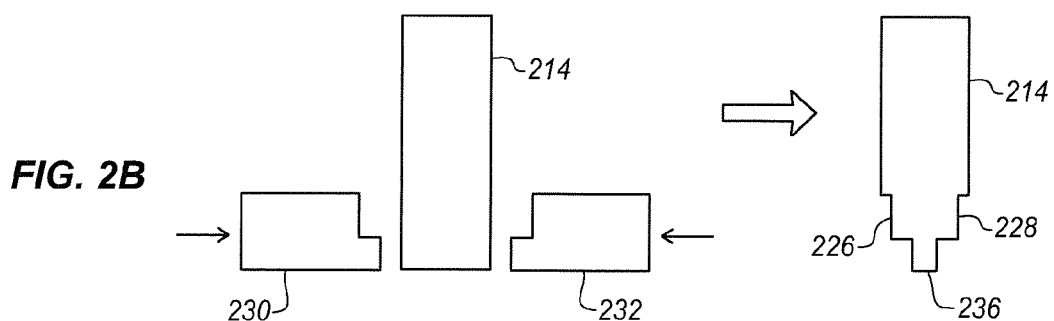
FIG. 2B is cross-sectional side view diagram and finished perspective view diagram of creating a pillar tip with stamping dies according to an embodiment.

FIG. 2B is a diagram of forming a tip using stepped dies 230 232. The tip of each probe wire can be struck with one or more dies which allow complex shapes to be produced depending upon the shape of the die. A beveled die as shown in FIG. 2A may be used. Alternatively a stepped die, as shown in the diagram of FIG. 2B, may be used. The stepped die results in a stepped profile at the end of probe tip. The tip 236 is at the end of the wire with edges 226 228 which are recessed from the tip on either side of the tip. In this example, the tip 236 is a ridge across the width of the probe tip wire. However, other shapes may be formed by modifying the shape of the dies.

Figure 3A:
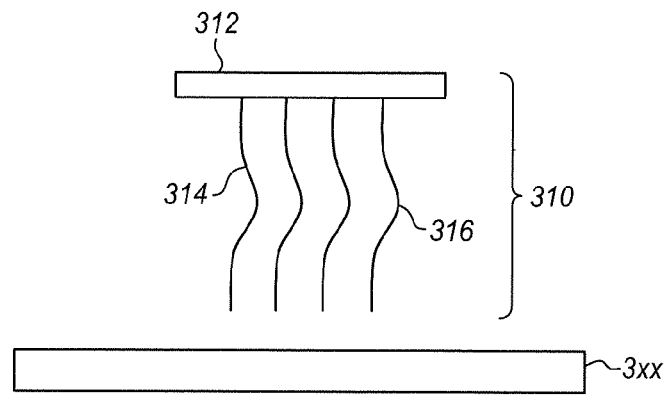
FIGS. 3A, 3B, and 3C are diagrams of sharpening probe tips against a lapping film according to an embodiment.

FIG. 3A is a diagram of a polishing method to create tips on the ends of wire probes that are already attached to a probe head. The probe head 310 includes a substrate 312 and many probe wires 314. The probe wires are shown with a bend 316 which allows the wires to be pressed on to another surface with resiliency. An abrasive lapping film 316 or any of a variety of other abrasive surfaces may be used to form tips on the ends of the wires 314. The technique described herein may be applied to form a point on a wire or to polish a point formed using any of the other techniques described herein such a micro-machining, die stamping, etc.

Figure 3B:
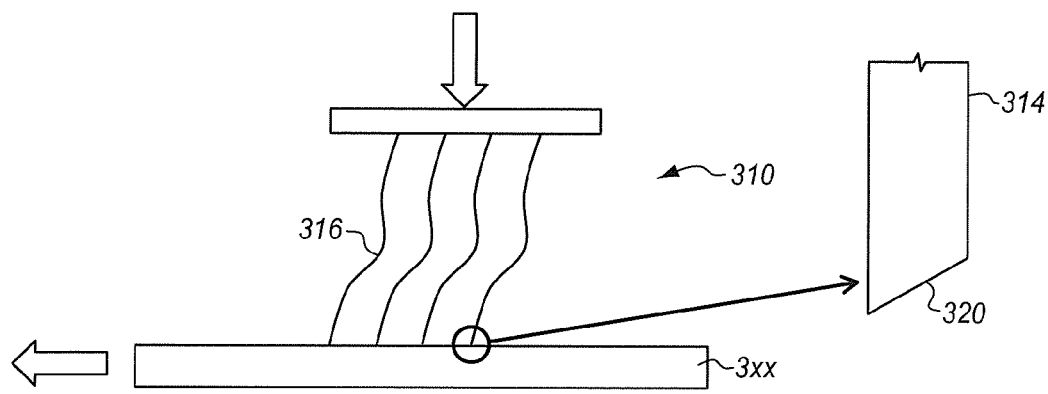

In the diagram of FIG. 3B, the fully assembled probe head is slowly brought into contact with the abrasive lapping film. The lapping film is mounted on to a flat or planar surface. Downward force is applied to deform the probes. As shown in FIG. 3B, the probes are easily deformed due to the bend 316 in the wires which allow the probes to absorb some amount of downward pressure. The downward force is limited to within the plastic deformation limit of the probes. The lapping film is then translated in one direction. In FIG. 3B the lapping film is being moved to the left. This translation motion polishes the ends of the probe wires forming a slanted edge 320 at the end of each wire 314. Alternatively, the probe head may be moved to the right while the lapping film stays still or both components may translate horizontally with respect to each other.

Figure 3C:
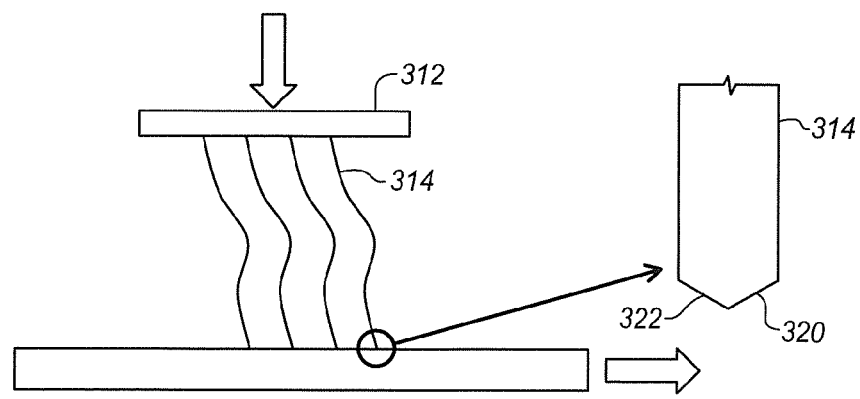

FIG. 3C is a diagram of forming the tip as a sharp ridge on the end of the wire 314. In FIG. 3C the lapping film is then moved or translated in the opposite direction to polish the opposite side of the wire. This forms a slanted edge 322 on the opposite side of the wire. The two edges form a wedge with the original slanted edge 320 and the second slanted edge 322 on opposite sides of the wire. The slanted edges define a pointed ridge. The amount of downward force on the probe head and the velocity of the lapping films motion may be used to control the angle of the wedge. The translation to the left and to the right of the lapping film may be repeated to form the desired shape. In addition, the pressure can be modulated to control the angle of the slant and to form curves or smooth edges as desired.

The technique of FIGS. 3A to 3C may also be used to form more than two slanted edges. The finished point in FIG. 3C is a ridge across the end of the wire. By moving the lapping film in three or more directions, three or more slanted edges can be formed. The three or more edges will from a point instead of a ridge.

Figure 4A:
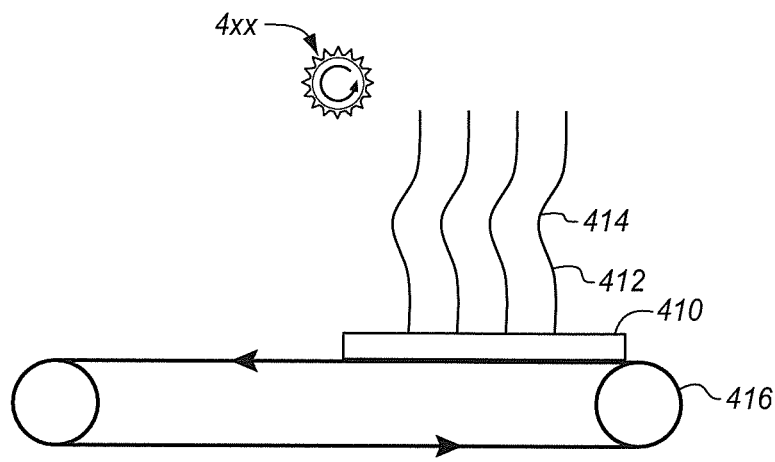
FIGS. 4A, 4B, and 4C are diagrams of sharpening probe tips against an abrasive drum according to an embodiment.

FIG. 4A is a diagram of another approach to polishing the wires 412 of a probe head 410 to form a pointed tip. In this example, the wires 412 are already mounted to the substrate 410 of the probe head so that all of the wires may be polished together in a single set of operations. The probe head is attached to a conveyer 416 which allows the probe head to be translated to the left and the right. An abrasive drum 420 is positioned so as to touch the wires of the probe head as the probe head is moved. The wires of the probe head have a bend 414 to provide resiliency when contacting the abrasive drum and also later when contacting a die pad. The fully assembled probe head is brought into contact with the rotating abrasive drum.

Figure 4B:
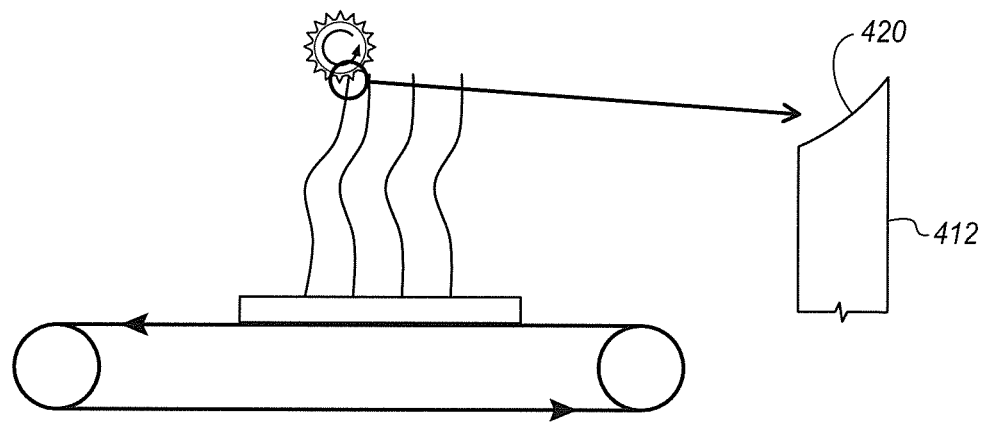
Figure 4C:
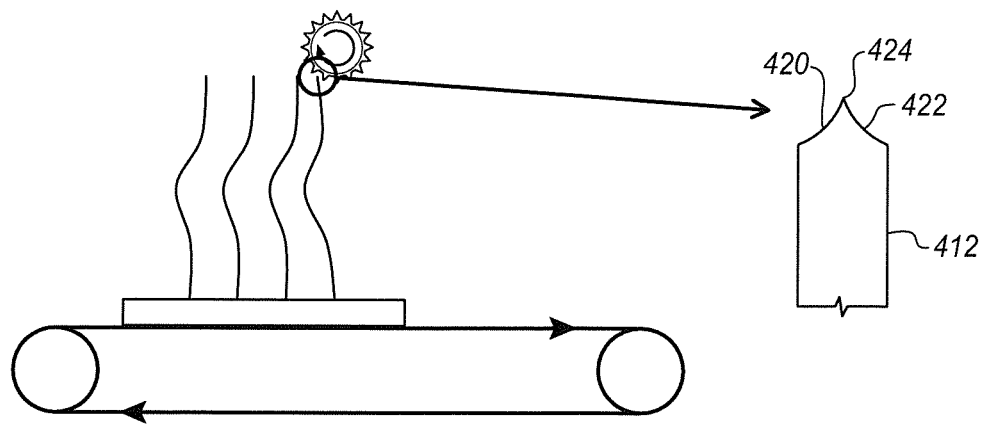

In FIG. 4B the first probe head probe tip is brought into contact with the drum to form a slant 420 on the end of the wire. In FIG. 4C the probe head wires have all passed across the abrasive drum and the direction of the conveyer is reversed to form a slant 422 on the opposite side of each wire creating a pointed tip 424 at the end of each wire 412. The velocity of the abrasive drum's rotation and the velocity of the conveyer's translation from left to right and right to left may be controlled to limit the deflection of each wire and to prevent the probe wires from contacting each other. This may cause defects in the wires. As in the examples of FIGS. 3A 3B and 3C, the wires may be sharpened at their ends after they are attached to the probe head the fully assembled probe head can be processed as a single device. In addition, more polishing cycles may be used to form other shapes on the wire tips.

Figure 5:
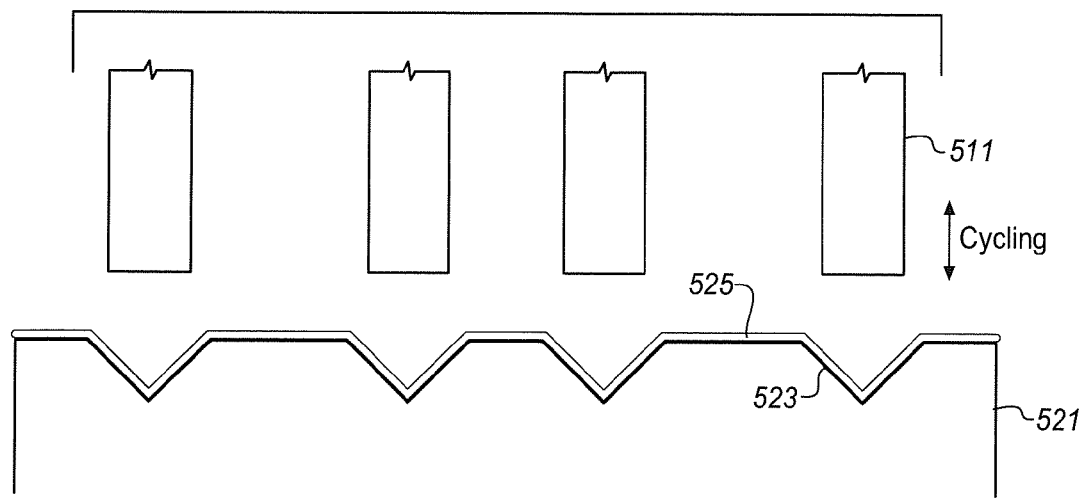
FIG. 5 is a side view diagram of sharpening probe tips using an abrasive etched wafer according to an embodiment.

FIG. 5 is a diagram of creating wedge tips for all of the wires on a probe head using an abrasive on a patterned substrate. In FIG. 5, each of the wires 511 is attached to a probe head (not shown) and is aligned with a patterned surface 521. The patterned surface may be formed of silicon or any other suitable material by etching, micro-machining, or drilling channels in the surface of the wafer. The probe head is brought into contact with a series of cavities, trenches, or holes that are patterned to receive every probe in the array. The channels 523 are covered in an abrasive coating 525. The abrasive coating may be layered across the entire substrate or just in the channels. As the probes are cycled through the pattern, their cross sections begin to conform to the shape of the cavity.

The fully assembled probe head may be brought into contact with the array of cavities, channels, or holes 523 depending on the particular construction of the substrate. These channels are patterned so that each channel can each receive one probe in the array. As the probe wires are cycled through the pattern, their cross sections begin to conform to the shape of the cavity. The wires may be pressed into the cavities to force the wires to conform to the shape of the cavity. Alternatively, the wires may be translated across the surface of the cavities similar to the example of FIGS. 3A 3B and 3C to polish the ends of the wires. The resulting edge for the example of FIG. 5 will resemble the wedged points shown in the examples above.

Figure 6:
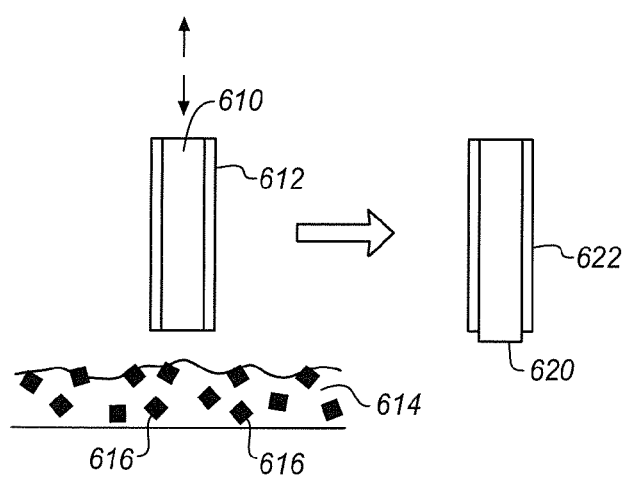
FIG. 6 is a cross-sectional side view diagram of sharpening a tip using an abrasive gel according to an embodiment.

FIG. 6 is a diagram of another technique for forming point tips on the ends of the wires of a probe head. In the example of FIG. 6, a probe tip wire 610 is coated 612 around its entire outer surface with a material that is mechanically softer than the material of the wire. The coated probe wire is then touched down into a gel material 614 that includes abrasive particles 616. The softer outer coating wears away more easily and faster than the core material. The wear produces a pillared tip 620. The pillared tip extends out further than the coating to form a type of point on the wire. This technique may be performed on a fully assembled probe head. Depending upon the nature of the abrasives 616 the wire 610 and the coating 612 the tips may be created for all of the wires simultaneously after the probe head is assembled. In some cases, the wires may be sharpened without having coated surfaces by driving uncoated wires 610 into the abrasive gel.

Figure 7:
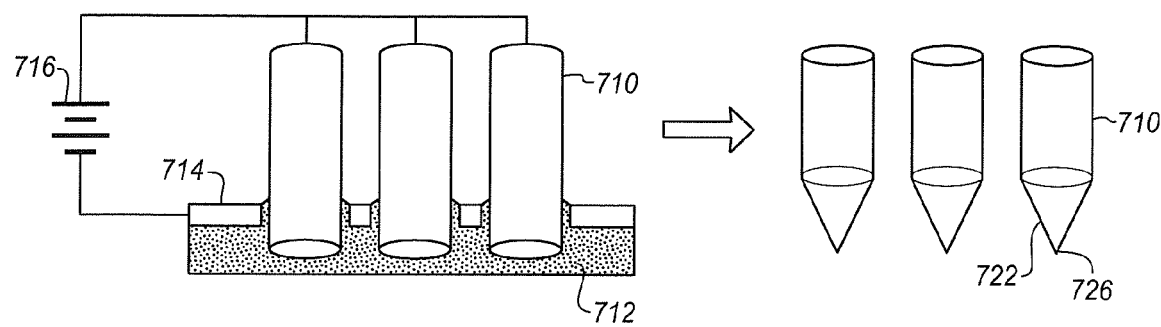
FIG. 7 is a diagram of sharpening a tip using an ionic solution according to an embodiment.

FIG. 7 is a diagram of another technique for sharpening the ends of probe wires 710 using an ionic solution 712. The tips of the wires 710 are pushed through perforations in an electrode 714 into the ionic solution 712. A potential is provided between the electrodes 714 and the probe wires 710. As shown, the entire array of probes attached to a probe substrate may be processed at the same time. The ionic solution serves as an electrolyte for electro polishing. A current is passed between the probe tips and the electrode to cause the polishing to occur. The fluid meniscus formation around the probe tips leads to a conical shape with a central point 26 and a circular cone edge 722 extending from the circular point 726 at the end of the wire.

In example of FIG. 6, the probe wire 610 is first coated with a softer material 610 before abrading. Coatings may also be used in the other examples to improve the shape of the point 620 at the end of the probe wire. Coatings may also be used to improve the resistivity and the hardness of the wire. Tip coatings may be applied using any of a variety of different deposition technique. Electroplating can be used to deposit metals such as Au, Rh, or Ni. These metals may also be deposited on the ends of the wire to increase conductivity. Depositing the coatings along the body of the probe wires may reduce the inter-probe spacing and increase the chance of electrical shorting across the probe wires.

Figure 8A:
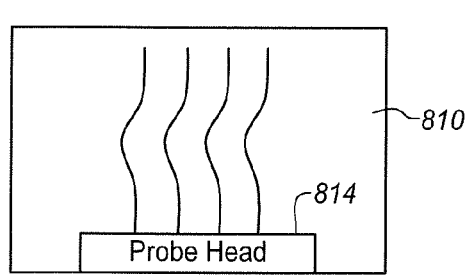
FIGS. 8A to 8D are diagrams of sharpening probe tips using an abrasive lapping film and a hot wax protective coating according to an embodiment.
Figure 8B:
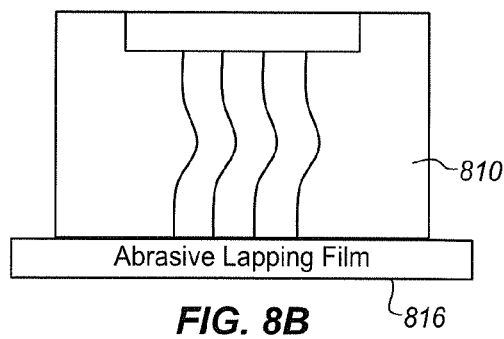
Figure 8C:
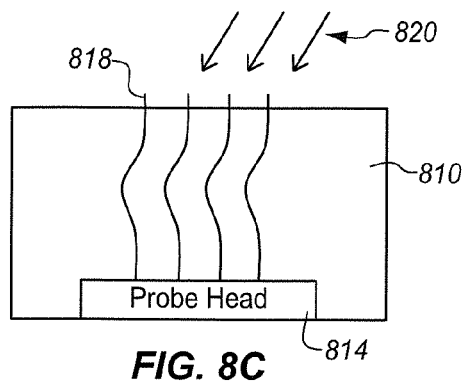
Figure 8D:
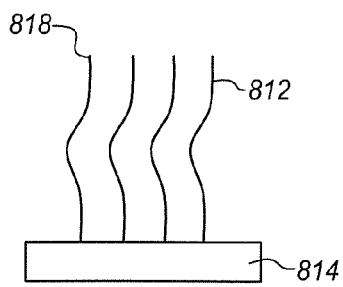

In order to coat the ends of the wires and not the bodies of the wires, the bodies of the wires may be masked. FIG. 8A is a diagram of a masking technique which involves pouring a solvent soluble hot wax 810 over a preheated array of probe wires 812 and allowing the wax to cool. In the diagram of FIG. 8B, the array is then translated over an abrasive lapping film 816 to remove the top layer of wax 810, exposing only the probe tips for plating. In FIG. 8C, a suitable coating metal is applied 820 to the exposed tips 818 of the probe wires 812. In FIG. 8D, after the plating step; the wax is removed leaving the probe wires with coating only on the wire tips 818. The wax can be melted off with heat or removed using solvents or both. The process may be applied to a completely assembled probe head before or after forming the tips.

Alternatively the tips may be coated using PVD (physical vapor deposition), such as cathodic arc deposition or magnetron sputtering, to apply a ceramic or other type of coating such as TiN, CrN, or ZrN. These coatings have an advantage of much higher hardness over metal coatings while still maintaining low electrical resistivity. The high hardness property helps to maintain the shape of the probe tip over its lifetime.

Figure 8E:
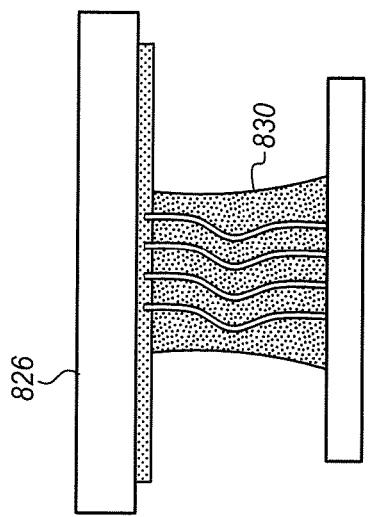
FIGS. 8E to 8J are diagrams of sharpening probe tips using an acid bath and a lacquer protective coating according to an embodiment.
Figure 8F:
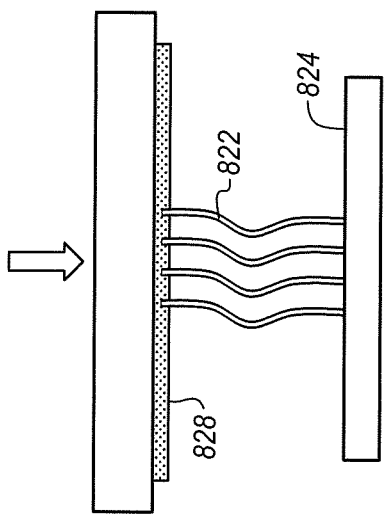
Figure 8H:
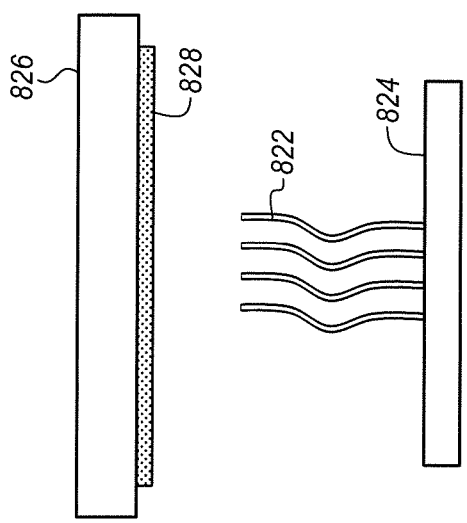
Figure 8G:
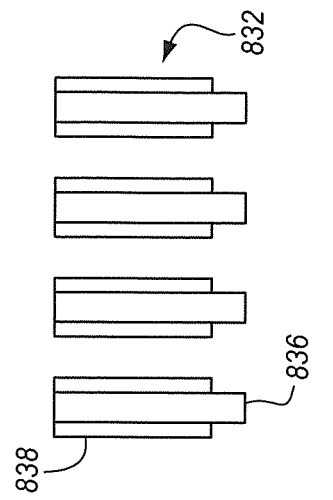

The end of the wires may be masked in a variety of other ways. In the example of FIG. 8E, the ends of the wires are etched in an acid bath while the bodies of the wires are coated with a lacquer for protection. An array of probe wires 822 are attached to a probe head 824. A plate 826 has a gel coating 828 facing the ends 832 of the probe wires 822. The plate 826 is pressed against the wires in FIG. 8F. In FIG. 8G an acid resistant lacquer is applied to the probe wires while the ends of the probe wires are covered in the gel. The lacquer may be applied by a spray on process or by a liquid dispensing process. In FIG. 8H, the plate is removed and the gel is removed providing the probe head 824 and wires 822 with the lacquer 830 covering all but the tips 832 of the wires.

Figure 8I:
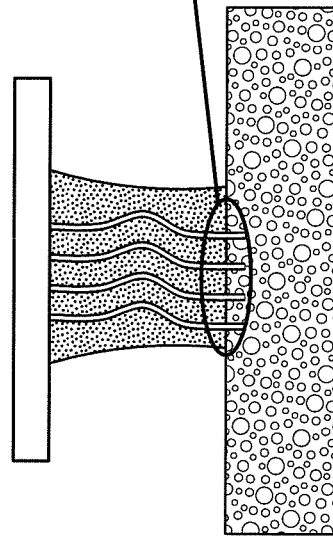
Figure 8J:
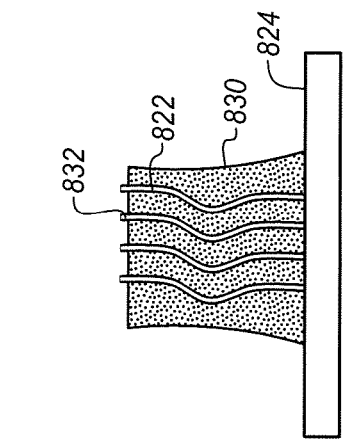

In FIG. 8I, the wires are applied to an acid bath. Only the tips are exposed because the rest of the wires are covered with the lacquer. After the etch, the lacquer is removed exposing the etched wires. FIG. 8J is a cross-sectional side view of the wire tips 832 showing the ends 836 exposed by the acid etch and the coating 838 which covers the rest of the probe wires. The result is a pillar type tip as described above. The coating is applied to the probe wires before the lacquer is applied. It serves to protect the wires and provides for the sharpened point after the acid etch. This is similar to the approach in FIG. 6. There may be multiple layers of coating so that the etch process provides for a more gradual changing in tip size from the central wire end 836 to the outermost coating layer 838. Any suitable coating material may be used that is affected by the acid in the acid bath, including those mentioned herein. The coating may be applied to the wires using any of the various techniques described herein, among others.

Figure 8L:
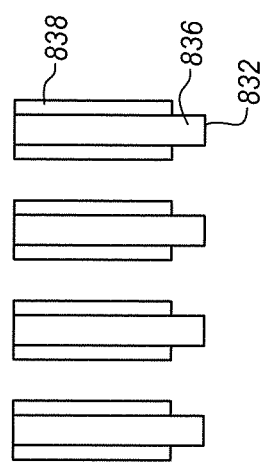
FIGS. 8K to 8N are diagram of sharpening probe tips using an acid bath and a lacquer protective coating according to another embodiment.
Figure 8N:
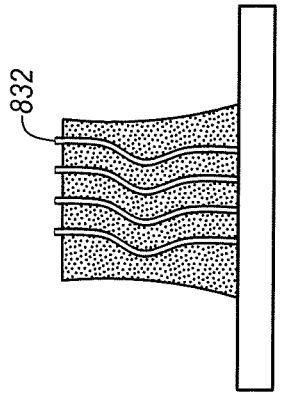
Figure 8K:
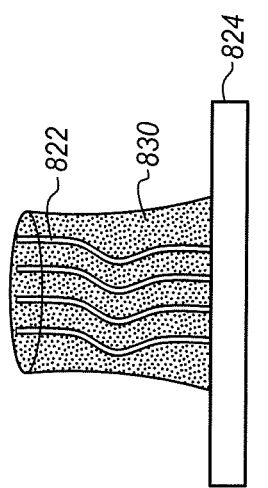

FIG. 8K shows a variation on the process just described. In FIG. 8K, lacquer 830 has been applied to the probe head 824 with wires 822. This has been done without the gel 828 and plate 826 of FIG. 8G. Because there is no gel, the ends of the wires are also covered in lacquer. These ends are then exposed after grinding the top of the lacquer as shown in FIG. 8L. The grinder may be selected to be soft enough to remove the lacquer but not remove a significant part of the wires.

Figure 8M:
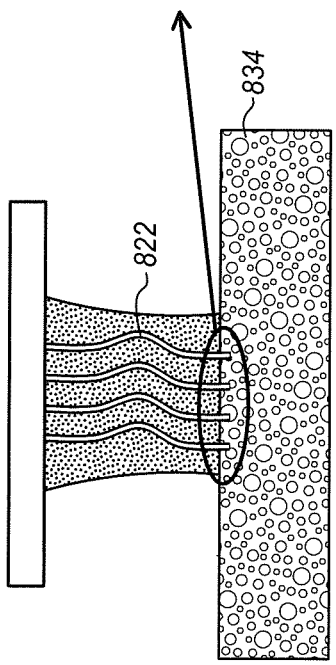

The exposed tips are then placed in the acid bat 834 as shown in FIG. 8M. This is similar to the process of FIG. 8I and FIG. 8N shows a result similar to that of FIG. 8J. A pillar end 832 is formed with an exposed central core 836 and a partially removed outer coating 838. As mentioned before, there may be more coating layers depending on the particular implementation. The coatings are selected to be removable in the acid bath, but not by the normal expected level of wear.

Using the techniques described herein a probe head for sort and singulated die testing can be produced using wires instead of buildup layers. This can be used to greatly reduce the overall cost of the testing. The cost of the probe head may be understood as a touchdown cost. The touchdown cost is the total cost for each touch down onto a DUT (Device Under Test), in other words, it is the cost of the probe tip divided by the number of times that the probe tip can be used. A more durable probe tip that can be used for more touchdowns will have a lower touchdown cost than one with fewer touchdowns. The techniques described above allow the probe tips to be produced at less cost and in some examples to survive more touchdowns before requiring replacement.

As described above conical tips and wedge tips can be created, among others. These may be coated using PVD or using a wax-based masking technique to coat only the tips. A low temperature, water soluble wax may be used to infiltrate the probe array, thereby masking the body of the probes.

Using mechanical cutting for example, as shown in FIGS. 2A and 2B, a wedge tip can be formed. The wedge tip may be formed using hardened steel or carbide, single bevel, cutting blades. The blades can be brought in from opposite sides of the probe. A probe wedge tip may also be created through mechanical cycling abrasion as shown in FIG. 5. The composite wire's cross section is maintained using any of a variety of different cavity geometries. A conical tip may be formed as in FIG. 7 using electropolishing. While the examples above may use more conventional materials a variety of different wire compositions may be used for the sort probes. The various techniques described above may be combined in different ways to form a particular desired shape for a probe tip.

Figure 9:
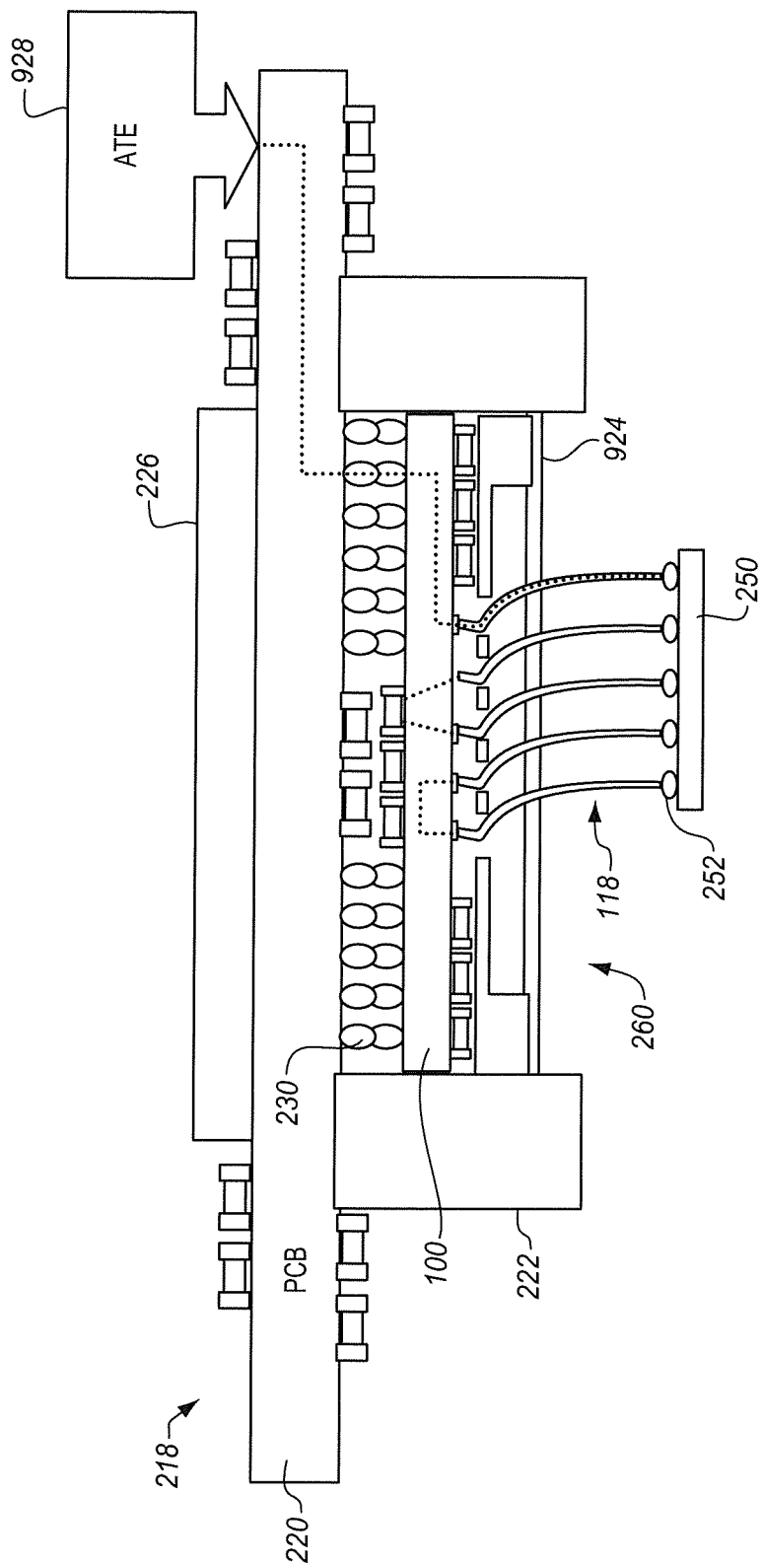
FIG. 9 is a side cross-sectional diagram of testing equipment using a probe head formed according to an embodiment.

FIG. 9 is an example of testing equipment capable of using the formed test probes 118 and space transformer 100 in a testing probe head 260 to test and sort dies 250 of various types. The space transformer 100 has a contact pad array formed of the test probes as described above. The test probes are arranged in a pattern to match with test sites on the device under test 250, such as a die. The wire test probes 118 each have a lower end configured and arranged for mating with a corresponding test pad 252 on the DUT 250 to be tested. The test probes 118 have a pitch that matches the pitch of the test pads 252 on the DUT 250.

A probe test head 260 carries the substrate and the test probes on a testing PCB (Printed Circuit Board) 220, which is strengthened by stiffening hardware 226. A mounting ring 222 holds the testing probe head 260 supported by the mounting ring to the PCB. A bottom side holder 924, attached to the mounting ring, secures the substrate 100 within the test head. The space transformer substrate 100, which, as described above, may be a multi-layered organic (MLO) or multi-layered ceramic (MLC) interconnect substrate has a connection side 230 opposite the test probes. This connection side is formed using pads that are created when the substrate is originally manufactured. In the illustrated example, the connections are in a BGA (Ball Grid Array) for mating with corresponding contacts on the PCB 220. The PCB then collects to ATE (Automated Test Equipment) 928 which drives the test and measures the results through the test probes.

The example of FIG. 9 is a generalized diagram of test equipment to show a context for use of the test probes produced as described above. The test probes may be used in many other types of test equipment, depending on the nature of the DUT and the type of test to be performed. The test probes may also be used to test dies that are packaged or dies that are packaged together with other dies.

It is to be appreciated that a lesser or more equipped cutter, polisher, abrasive, lapping film, coating, wire, or probe head, may be preferred for certain implementations. Therefore, the configuration of the exemplary systems and components may vary from implementation to implementation depending upon numerous factors, such as price constraints, performance requirements, technological improvements, or other circumstances.

Figure 10:
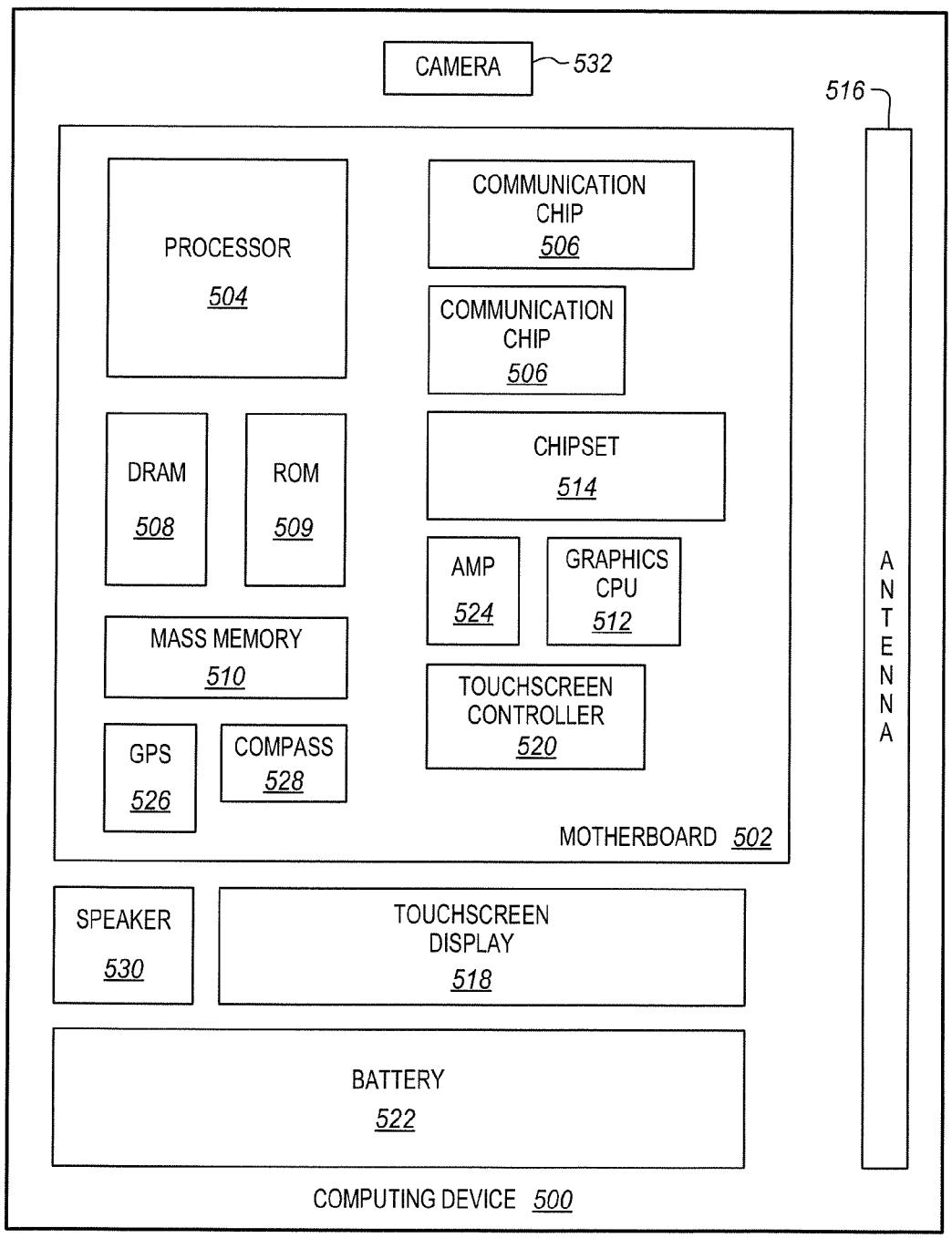
FIG. 10 is a block diagram of a computing device suitable for use with embodiments.

FIG. 10 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged together using a multiple level redistribution layer, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be adapted to be used with a variety of different probe wires, probe heads, and devices under test using various types of testing equipment for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method of preparing tips of wires of a test probe head for use as test probes, the test probe head having a plurality of resilient wires. The method includes attaching a plurality of wires to a test probe head substrate, each of the wires having two ends, one end being attached to the substrate and the other end opposite the substrate having a tip, and polishing the tips of the wires when attached to the test probe head to form a sharpened point.

Some embodiments include polishing the tips simultaneously using a lapping film. In some embodiments polishing includes pressing the test probe head toward a lapping film so that the tips contact the lapping film, the lapping film being mounted to a surface, and translating the lapping film across the tips as the tips contact the lapping film to abrade a side of each tip. Some embodiments include translating the lapping film across the tips in a different direction to abrade another side of the each tip and form a point.

In some embodiments polishing includes polishing the tips against an abrasive drum. In some embodiments polishing includes translating the tips across a rotating drum so that the tips are bent against the drum to abrade a side of each tip. In some embodiments polishing includes translating the tips across a rotating drum so that the tips are bent against the drum to abrade an opposite side of each tip and form a point. In some embodiments polishing includes repeatedly pressing the test probe head toward an abrasive template so that the tips are abraded to form a shape defined by the template. In some embodiments polishing includes repeatedly pressing the test probe head toward an abrasive gel so that the tips are abraded by the abrasive gel to form a point. In some embodiments polishing includes electropolishing by applying a voltage to the tips and simultaneously immersing the tips into an electrolyte.

Some embodiments include coating the tips before polishing. In some embodiments coating includes electroplating with a conductive metal that is softer than the wires. In some embodiments coating includes depositing a ceramic coating using physical vapor deposition. Some embodiments include masking the wires except for the wire tips before coating so that only the tips of the wires are coated. In some embodiments masking includes covering the wires in wax, and abrading the tips to remove the wax over the tips.

Some embodiments include masking the wires before polishing the tips by covering the wires in a lacquer. Some embodiments include abrading the tips to remove the lacquer over the tips. Some embodiments include covering the tips with a gel before covering the wires in the lacquer, and removing the gel after covering the wires to expose the tips. In some embodiments polishing the tips includes applying the tips to an acid bath to sharpen the tips by removing a portion of the coating.

Some embodiments pertain to an apparatus with a probe substrate having a plurality of attached resilient test probe wires each formed by first attaching the test probe wires to the substrate and then polishing the tips of the wires to form a sharpened point, a probe substrate carrier to hold the probe substrate in a fixed position, and a lift mechanism coupled to the probe substrate carrier to move the wires of the probe substrate into contact with a device under test.

In some embodiments the tips are polished by applying the test probe wires to an abrasive when attached to the test probe. In some embodiments the abrasive is at least one of a rotating drum, a lapping film, an abrasive gel, and an acid bath.

Some embodiments pertain to a die test system for testing semiconductor dies using a probe head, the system having a testing probe head having a substrate and a plurality of test probes coupled to the substrate, the test probes being formed by first attaching a plurality of wires to the substrate and then sharpening the tips of the wires to form a point, a stiffened board to carry the testing probe head, a clamp to hold the testing probe head against the stiffened board, and automated test equipment to drive a test and measure the results through the test probes. In some embodiments, the wires are coated after being attached to the substrate and then the tips are sharpened by removing a portion of the coating. In some embodiments, the wires are laser cut after being attached to the substrate to sharpen the tips.

What is claimed is:

1. A method of preparing tips of wires of a test probe head for use as test probes, the test probe head having a plurality of resilient wires, the method comprising:
    attaching a plurality of pre-formed off-the-shelf metallic wires to a test probe head substrate using an automated process, the test probe head substrate being formed of a multi-layer organic interconnect substrate and having a connection side configured for attachment to a probe substrate carrier on one side to press the wires against a device under test on an opposite side, each of the wires having two ends, one end being attached to the substrate and the other end opposite the substrate having a tip;
    coating the tips of the wires together when attached to the test probe head with a softer material than the material of the wires; and
    polishing the coated tips of wires together when attached to the test probe head after coating the tips to form a sharpened point configured for electrical contact with the device under test; and
    coating the polished tips with material having a higher hardness than the material of the wire.

2. The method of claim 1, wherein polishing comprises polishing the tips simultaneously using a lapping film.

3. The method of claim 2, wherein polishing comprises:
    pressing the test probe head toward a lapping film so that the tips contact the lapping film, the lapping film being mounted to a surface; and
    translating the lapping film across the tips as the tips contact the lapping film to abrade a side of each tip.

4. The method of claim 3 wherein polishing futher comprises translating the lapping film across the tips in a different direction to abrade another side of the each tip and form a point.

5. The method of claim 1, wherein polishing comprises polishing the tips against an abrasive drum.

6. The method of claim 5, wherein poiishing comprises translating the tips across a rotating drum so that the tips are bent against the drum to abrade a side of each tip.

7. The method of claim 6, wherein polishing further comprises translating the tips across a rotating drum so that the tips are bent against the drum to abrade an opposite side of each tip and form a point.

8. The method of claim 1, wherein polishing comprises repeatedly pressing the test probe head toward an abrasive template so that the tips are abraded to form a shape defined by the template.

9. The method of claim 1, wherein polishing comprises repeatedly pressing the test probe head toward an abrasive gel so that the tips are abraded by the abrasive gel to form a point.

10. The method of claim 1, wherein polishing comprises electropolishing by applying a voltage to the tips and simultaneously immersing the tips into an electrolyte.

11. The method of claim 1, wherein coating comprises electroplating with a conductive metal that is softer than the wires.

12. The method of claim 1, wherein coating comprises depositing a ceramic coating using physical vapor deposition.

13. The method of claim 1, further comprising masking the wires except for the wire tips before coating so that only the tips of the wires are coated.

14. The method of claim 13, wherein masking the wires comprises:
    covering the wires in wax; and
    abrading the tips to remove the wax over the tips.

15. The method of claim 1, further comprising masking the wires before polishing the tips by covering the wires in a lacquer.

16. The method of claim 15, further comprising abrading the tips to remove the lacquer over the tips.

17. The method of claim 15, further comprising;
    covering the tips with a gel before covering the wires in the lacquer; and
    removing the gel after covering the wires to expose the tips.

18. The method of claim 15, wherein polishing the tips comprises applying the tips to an acid bath to sharpen the tips by removing a portion of the coating.

19. The method of claim 1, further comprising attaching the probe head substrate to a probe substrate carrier to hold the probe head substrate in a fixed position.

20. The method of claim 19, further comprising moving the wires of the probe head substrate into contact with a device under test using a lift mechanism coupled to the probe substrate carrier.

21. The method of claim 20, further comprising driving a test of the device under test using an automated test equipment and receiving results at the automated test equipment through the attached wires.

* * * * *